(12) United States Patent
Honmou

(10) Patent No.: US 6,212,212 B1
(45) Date of Patent: Apr. 3, 2001

(54) OPTICAL MODULE

(75) Inventor: Hiroshi Honmou, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/145,244

(22) Filed: Sep. 2, 1998

(30) Foreign Application Priority Data

Sep. 2, 1997 (JP) .................................................. 9-237012

(51) Int. Cl.$^7$ ....................................................... H01S 5/00
(52) U.S. Cl. .................. 372/43; 372/43; 372/36; 372/34
(58) Field of Search ................... 372/43, 36, 34

(56) References Cited

U.S. PATENT DOCUMENTS

| | | | | |
|---|---|---|---|---|
| 5,796,714 | * | 8/1998 | Chino et al. | 372/50 |
| 5,835,650 | * | 11/1998 | Kitaoka et al. | 385/49 |
| 6,069,904 | * | 5/2000 | Kitaoka et al. | 372/32 |
| 6,088,378 | * | 7/2000 | Furukawa | 372/92 |

FOREIGN PATENT DOCUMENTS 8-306844  11/1996 (JP).
9-64479   3/1997 (JP).

OTHER PUBLICATIONS

"A Surface Mount Type Optical Module for Subscriber Networks" *Electronics Society Conference of IEICE*, sc–1–12, 1995, pp. 331–332.

* cited by examiner

Primary Examiner—Frank G. Font
Assistant Examiner—Delma R. Flores Ruiz
(74) Attorney, Agent, or Firm—Young & Thompson

(57) ABSTRACT

An electrode of a laser diode (LD) is joined with a Si substrate via a solder layer. A cavity region is formed directly under the LD in the solder layer. The solder layer spreads outside the cavity region. Since there arises no stress in a space of the cavity region, the internal stress of the active layer, which is formed directly over the cavity region, is relaxed as compared with that in a conventional optical module, which is provided with no cavity region in the solder layer. Accordingly, a highly reliable optical module can be obtained.

10 Claims, 1 Drawing Sheet

OPTICAL MODULE

FIELD OF THE INVENTION

The invention relates to an optical module mounting an optical device, such as a semiconductor laser diode or a photodiode.

BACKGROUND OF THE INVENTION

An optical module, which optically couples an optical transmission line, such as an optical fiber, with an optical device, such as a semiconductor laser (LD, hereinafter) or a photodiode (PD, hereinafter), plays an important role in constructing an optical communication system.

In a method for mounting an optical device on a substrate, the optical device is mounted on a Si substrate in most cases. For example, such an optical module is reported by K. Kurata and others in a paper "A surface mount type optical module for subscriber network", Proceeding of the 1995 Electronics Society Conference of IEICE, SC-1-12.

In the optical device mounted on the substrate by soldering, an internal stress remains behind in the active layer or the photoabsorption layer of the soldered optical device, because of the difference in the thermal expansion coefficients between the optical device and the substrate, hence the optical device is short-lived and reliability of the optical module deteriorates. Especially, in an array optical device of multi-channels, since the amount of thermal contraction of the optical devices is larger than that in the optical device of single channel, there has been further apprehension for deterioration of reliability.

SUMMARY OF THE INVENTION

Accordingly, it is an object of the invention to provide an optical module, which is highly reliable and contributes for integration and miniaturization of an optical circuit by decreasing an internal stress in an active layer or a phtoabsurption layer of an optical device.

According to the feature of the invention, an optical module comprises:

an optical device provided with a first electrode formed on a bottom surface thereof, a substrate provided with a second electrode formed on a top surface thereof, a solder layer region for joining the first and second electrodes, and a cavity region formed directly under the optical device in the solder layer region.

BRIEF DESCRIPTION OF THE DRAWINGS

The invention will be explained in more derail in conjunction with appended drawings, wherein.

DESCRIPTION OF THE PREFERRED EMBODIMENTS

Figure 1:
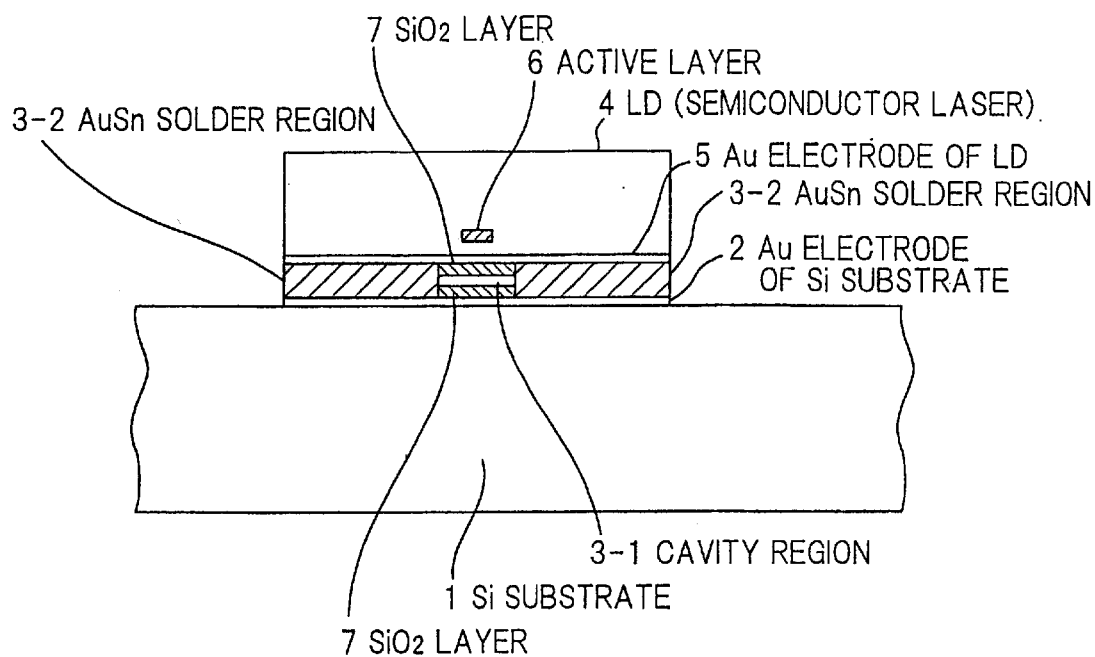
FIG. 1 is a cross-sectional view of a preferred embodiment of the invention.

In the embodiment of FIG. 1, the electrode 5 of a LD and an electrode 2 formed on a Si substrate 1 are joined with solder. The electrode 5 is formed on the bottom surface of the LD 4 near the active layer 6. In a cavity region 3-1 formed under the active layer 6, there is no solder, and the solder layer region 3-2 spreads in parallel with both the electrodes 2 and 5 outside the cavity region 3-1.

According to such a structure, there arises no stress in the space of the cavity region 3-1, which is formed directly under the active layer 6. Consequently, a stress in the active layer 6 formed directly overhead the cavity region 3-1 is relaxed as compared with that in a conventional structure, in which no cavity region is provided in the solder layer region.

Next, explanation will be given to the concrete embodiment referring to FIG. 1. The LD 4 is an InP semiconductor laser of edge emission type, and the length, the width and the depth of its cavity (lasing cavity) are respectively 200 $\mu$m, 250 $\mu$m and 1000 $\mu$m. The Au electrode 5 near the active layer 6 is joined with the Au electrode 2 formed on the Si substrate 1 by the AuSn solder layer region 3-2. The width and the thickness of the active layer are respectively 1 $\mu$m and 0.2 $\mu$m, the thickness of the Au electrodes 2 and 5 are respectively 1$\mu$m, the thickness of the AuSn solder layer is 2 $\mu$m, and the width of the cavity region 3-1 is 60 $\mu$m. 0.1 $\mu$m thick $SiO_2$ layers 7 are respectively formed on the inner surfaces of the Au electrodes 2 and 5 in the cavity region 3-1 in order to prevent penetration of AuSn solder into the cavity region 3-1.

Figure 2:
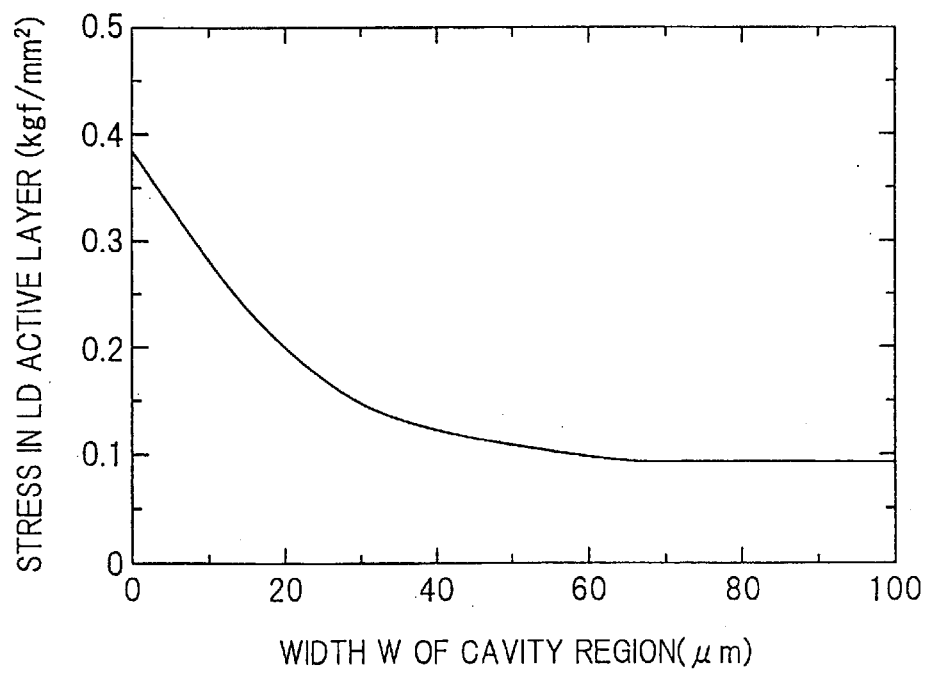
FIG. 2 is a diagram for showing a relation between a width W of a cavity region and an internal stress of an active layer.

FIG. 2 shows a relation between the width W of the cavity region 3-1 and the internal stress of the active layer 6, after the LD 4 is soldered to the Si substrate 1. In case that the width W of the cavity region 3-1 is zero, in other words, in case that a conventional method for soldering, in which the cavity region 3-1 is not provided, is used, there arises a large stress in the active layer. However, the stress decreases, as the width W of the cavity region increases.

According to the embodiment mentioned in the above, in case that the width W of the cavity region 3-1 is 60 $\mu$m, the stress is reduced to one-fourth of the conventional one. In the space of the cavity region 3-1 formed directly under the active layer, there arises no stress. Accordingly, after the LD is soldered to the Si substrate 1, the internal stress in the active layer 6 formed directly overhead the cavity region 3-1 is relaxed as compared with that in the conventional structure, in which the LD 4 is directly soldered to the Si substrate 1 via a solder layer region provided with no cavity region. Consequently, the reliability of an optical device, which is mounted on the Si-substrate by means of the solder layer region according to the invention, is improved.

In case that the cavity region 3-1 is formed directly under the active layer 6, it is apprehended that conduction of heat generate in the active layer 6 is obstructed by the cavity region 3-1 and diffusion of heat is disturbed. However, since the cavity region 3-1 is thin, heat in favorably conducted therethrough and no problem occurs on diffusion of heat.

Although FIG. 2 shows the relation between the stress of the active layer 6 and the width W of the cavity region 3-1, a similar relation is observed in one between the stress of the photoabsorption layer of a photodiode and the width W of the cavity region. That is to say, the stress in the photoabsorption layer of the photodiode can be relaxed by forming the cavity region formed directly under the photoabsorption layer in the solder layer region, and reliability of the photodiode can be improved.

In the aforementioned embodiment, the bottom surface of the LD, which is joined with the solder layer, is flat. However, the bottom surface of the LD 4 may be formed into a mesa like shape in order to improve the characteristic of the LD 4. In such a case, if a cavity region is formed in the solder layer as in the case of the aforementioned embodiment, the effect of the invention can be exhibited.

In the aforementioned invention, the 0.1 μm thick $SiO_2$ layers 7 are respectively formed on the electrode 5 of the LD 4 and the electrode 2 formed on the surface of the Si substrate 1 in order to prevent penetration of solder into the cavity region 3-1. However, the $SiO_2$ layer 7 may be formed on an electrode selected from the electrodes 5 and 2. In such a case, one of the top and bottom surfaces of the cavity region 3-1 is covered with solder film, but the effect on the invention can be exhibited.

Moreover, in the aforementioned embodiment, the width W of the cavity region is selected to be 60 μm. However, the width of the cavity region can be selected at will, so long as the stress in the cavity layer 6 is kept within a tolerance limit and the mechanical strength of joining is sufficient. In the aforementioned embodiment, the LD of a single channel is mounted on the substrate. However, the invention can be applied to an array LD, which is composed of plural LDs arranged along a line. In this case, the respective LDs maybe provided with the cavity regions formed directly under the respective LDs in the solder layer region.

Furthermore, the LD is used as an optical device in the aforementioned embodiment, but the optical device is never restricted to the LD. The invention can be applied to other kinds of optical devices, such as a photodiode of a waveguide type, which receives a light incident on its edge surface, a semiconductor laser of distributed feed back type (a DFB-LD, hereinafter), a semiconductor amplifier and an array optical device. For example, in a case of the PD of the waveguide type, the cavity region can be provided under the photoabsorption layer in the solder layer region.

In the case of the DFB-LD, since a grating is formed in the active layer, reliability of the active layer can be improved, uncertainty of the characteristic of the grating caused by internal stress is reduced, and its operation characteristic can be stabilized, by forming the cavity region directly under the active layer.

In a optical module according to the invention, the cavity region, which is formed directly under the active layer or the photabsorption of the optical device, is a space with no solder, and there is the solder layer region outside the cavity region. According to this structure, there arises no stress in a space in the cavity region. Consequently, the internal stress in the active layer or the photoabsorption layer, which is formed directly overhead the cavity region, is relaxed as compared with that in the conventional optical module, in which no cavity region is provided, hence reliability of the optical device is improved.

Since the invention can be applied the array optical device, in which plural optical devices are arrange along a line, the integrated and miniaturized optical module with high reliability can be provided. Since the electrode near the active layer or the photoabsorption layer of the optical device can be joined with the substrate and pedestals for adjusting the heights of the optical device can be further formed on the substrate, regulation of the heights of the optical device, which is indispensable for mounting the optical device in a way of passive alignment, can be made to be easy, which contributes to reduction of time and labor necessary for alignment of optical axes. Accordingly, the optical module with high reliability can be provide at low a price.

Moreover, in the case of the DFB-LD, since uncertainly of its characteristic caused by inner stress of the grating formed therein is reduced, the DFB-LD with excellent characteristic can be provided at a low price.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An optical module, comprising:

an optical device provided with a first electrode formed on a bottom surface thereof, a substrate provided with a second electrode formed on a top surface thereof, a solder layer region for joining said first and second electrodes, and a cavity region formed under said optical device in said solder layer region.

2. An optical module according to claim 1, wherein:

said cavity region spreads in parallel with said first and second electrodes.

3. An optical module according to claim 1, wherein:

a width of the said cavity region is larger than that of an active layer or a photoabsorption layer of said optical device.

4. An optical module according to claim 1, wherein:

said cavity region is directly under said active layer or said photoabsorption layer of said optical device.

5. An optical module, comprising:

an optical device provided with a first electrode formed on a bottom surface thereof, a substrate provided with a second electrode formed on a top surface thereof, a solder layer region for joining said first and second electrodes, and a cavity region formed directly under said optical device in said solder layer region, wherein:
oxide layers are formed on inner surfaces of said first and/or second electrodes corresponding to said cavity region.

6. An optical module according to claim 1, wherein:

said optical device is an array optical device, composed of plural elementary optical devices.

7. An optical module according to claim 6, wherein:

said cavity region is subdivided into plural elemental cavities, each of which is formed directly under said corresponding elementary optical device.

8. An optical module according to claim 1, wherein:

said optical device is a semiconductor laser diode.

9. An optical module, comprising:

an optical device provided with a first electrode formed on a bottom surface thereof, a substrate provided with a second electrode formed on a top surface thereof, a solder layer region for joining said first and second electrodes, and a cavity region formed directly under said optical device in said solder layer region, wherein:

said optical device is a photosensor.

10. An optical module according to claim 1, whrein:

said substrate is a Si substrate.

* * * * *